US011137430B1

(12) United States Patent
Tsironis (10) Patent No.: US 11,137,430 B1
(45) Date of Patent: Oct. 5, 2021

(54) ACTIVE LOAD PULL TUNING SYSTEM FOR MODULATED SIGNAL

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 19 days.

(21) Appl. No.: 16/454,120

(22) Filed: Jun. 27, 2019

Related U.S. Application Data (60) Provisional application No. 62/691,379, filed on Jun. 28, 2018.

(51) Int. Cl.
*G01R 27/32* (2006.01)
*G01R 35/00* (2006.01)

(52) U.S. Cl.
CPC .......... *G01R 27/32* (2013.01); *G01R 35/005* (2013.01)

(58) Field of Classification Search
CPC .............................. G01R 27/32; G01R 35/005
See application file for complete search history.

(56) References Cited

U.S. PATENT DOCUMENTS

| 5,276,411 | A  | 1/1994  | Woodin et al. |
| 6,639,393 | B2 | 10/2003 | Tasker et al. |
| 7,282,926 | B1 | 10/2007 | Verspecht et al. |
| 8,456,175 | B2 | 6/2013  | Marchetti et al. |
| 9,331,670 | B1* | 5/2016 | Mahmoudi ........ G01R 31/2822 |
| 10,444,266 | B1* | 10/2019 | Tsironis ............. G01R 31/2608 |

OTHER PUBLICATIONS

Load Pull, online, Wikipedia [Retrieved on Nov. 18, 2016]. Retrieved from Internet <URL: http://en.wikipedia.org/wiki/Load_pull>.
"Computer Controlled Microwave Tuner, CCMT", Product Note 41, Focus Microwaves Inc., Jan. 1998, pp. 2-4.
"Measurement of Impedance Tuner", Yangping Zhao of Poly Grames, Power point presentation, Mar. 25, 2014.
PIN Diodes [online] Wikipedia [Retrieved on Jun. 10, 2018] Retrieved from Internet <URL: https://en.wikipedia.org/wiki/PIN_diode>.
Varicap [online] Wikipedia [Retrieved on Jun. 10, 2018] Retrieved from Internet <URL: https://en.wikipedia.org/wiki/Varicap>.
Microelectromechanical systems [online] Wikipedia [Retrieved on Jun. 11, 2018] Retrieved from Internet <URL https://en.wikipedia.org/wiki/Microelectromechanical_systems>.

* cited by examiner

*Primary Examiner* — Tung X Nguyen
*Assistant Examiner* — Feba Pothen (57) ABSTRACT

A high speed active tuning system for wideband modulated signals comprises a slabline with an adjustable signal coupler (wave-probe) and an electronic tuner in a feedback signal injection loop. The wave-probe controls the static amplitude and phase of the feedback signal and the electronic tuner controls the actual amplitude and phase of the re-injected signal. High speed calibration and search routines allow identifying tuner states satisfying instantaneously impedance targets over the entire modulation bandwidth.

8 Claims, 14 Drawing Sheets

EXPANDED VIEW

ACTIVE LOAD PULL TUNING SYSTEM FOR MODULATED SIGNAL

PRIORITY CLAIM

This application claims priority on provisional application 62/691,379, titled "Active Load Pull Tuning System for Modulated Signal", filed on Jun. 28, 2018.

CROSS-REFERENCE TO RELATED ARTICLES

1. Load Pull [online] Wikipedia [Retrieved 2016-11-18] Retrieved from Internet <URL: http://en.wikipedia.org/wiki/Load_pull>
2. "Computer Controlled Microwave Tuner, CCMT", Product Note 41, Focus Microwaves Inc. 1998, pages 2-4.
3. Verspecht et al. U.S. Pat. No. 7,282,926: "Method and an apparatus for characterizing a high-frequency device-under-test in a large signal impedance tuning environment".
4. Woodin et al., U.S. Pat. No. 5,276,411, "High power solid state programmable load".
5. "Measurement of Impedance Tuner", Yangping Zhao of Poly Grames, Power point presentation, 2014-03-25.
6. Marchetti, M, U.S. Pat. No. 8,456,175, "Open loop load pull arrangement with determination of injections signals".
7. Tasker et. Al. U.S. Pat. No. 6,639,393, "Methods and apparatus for time-domain measurement with a high frequency circuit analyzer".
8. PIN Diodes [online] Wikipedia [Retrieved on 2018 Jun. 10] Retrieved from Internet <URL: https://en.wikipedia.org/wiki/PIN_diode>
9. Varicap [online] Wikipedia [Retrieved on 2018 Jun. 10] Retrieved from Internet <URL: https://en.wikipedia.org/wiki/Varicap>
10. Microelectromechanical systems [online] Wikipedia [Retrieved on 2018 Jun. 11] Retrieved from Internet <URL https://en.wikipedia.org/wiki/Microelectromechanical_systems>

BACKGROUND OF THE INVENTION AND PRIOR ART

This invention relates to Non-50 Ohm load pull testing of microwave transistors (DUT) subject to modulated signal (see ref. 1). Load pull is the method by which the load impedance presented to the DUT at a given frequency is changed systematically and the DUT performance is registered, with the objective to find an optimum depending on the overall design objectives. This may be maximum power, efficiency, linearity or else.

Figure 1:
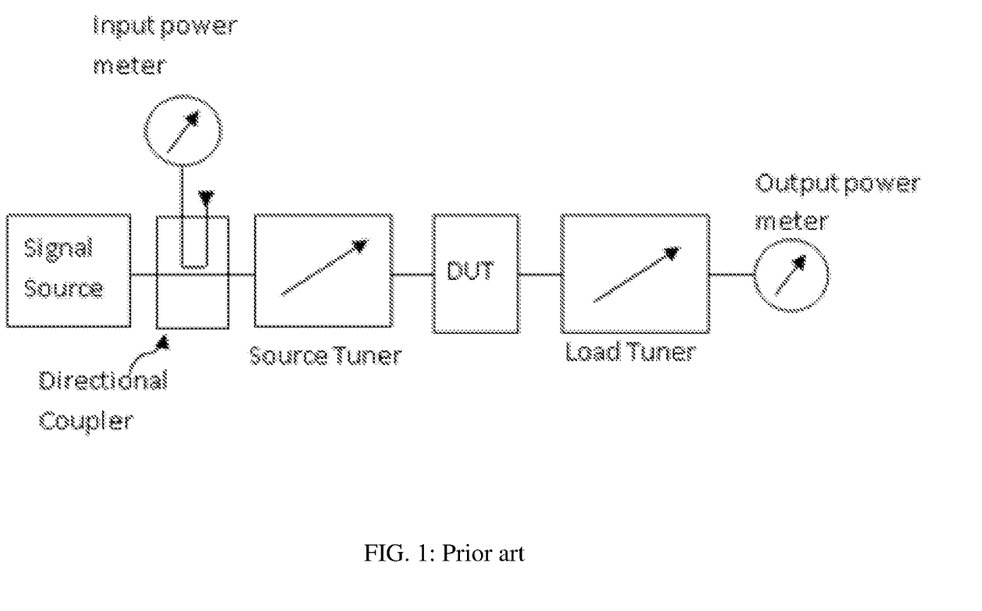
FIG. 1 depicts prior art, a typical load pull test system using passive tuners.

A load pull test system is shown in FIG. 1. It comprises a signal source, source and load impedance tuners, a device under test (DUT, transistor) in a test fixture (that can also be a micro-chip on a semiconductor wafer connected to using microscopic wafer probes) and input and output measurement instruments. The instruments can measure power, DC bias and various spectral components, generated either by the source or by the non-linearities of the DUT. The tuners and the instruments are controlled by a PC controller using appropriate digital communication protocols (GPIB, RS 232, LAN etc.). The data acquired by the test software comprise RF and DC response of the DUT to input stimulus for given source and load impedances. This data is saved in load pull files and serve to a) qualify the DUT and b) design optimum matching networks for given target performance, this being output power, linearity, efficiency etc.

Figure 14:
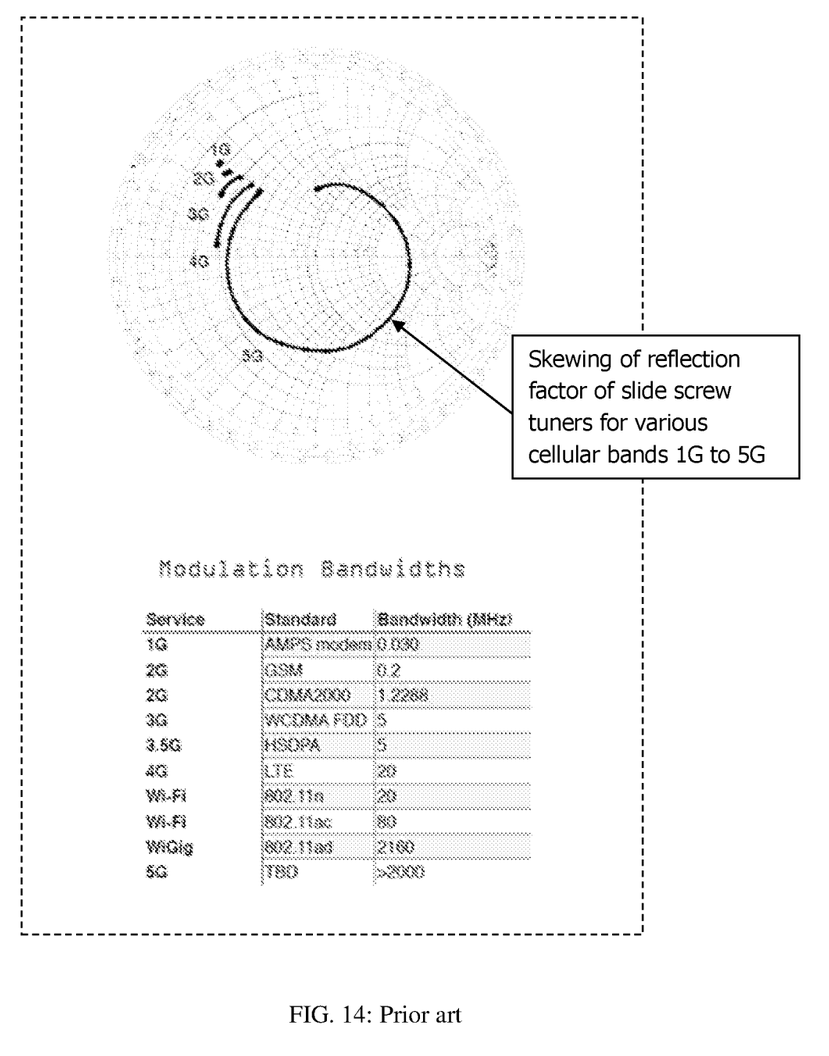
FIG. 14 depicts prior art: typical skewing figures of passive slide screw tuners for the various cellular band first to fifth generation (1G to 5G) and associated modulation bandwidth.

Passive slide-screw tuners (see ref. 2) are used in the industry for non-50 Ohm measurements. They use a slotted airline and several metallic, wideband reflective probes inserted in the slabline channel and coupled capacitively with the center conductor to create an amplitude and phase controllable reflection factor. Those tuners have three inherent limitations: a) they have moving mechanical parts, thus they are relatively slow (tuning is in the range of seconds); b) they can only reach maximum reflection factor $|\Gamma|<0.95$ at the tuner reference plane; transferred to the DUT reference plane the reflection factor is lower, due to interfering adapter, cable and test fixture insertion loss; c) they have phase skewing trajectory behavior when reflecting modulated signals. Skewing means the reflection factor (specifically the phase) changes considerably within the frequency band of the modulation. The angle $\Phi$ skewing depends on the modulation frequency $\Delta F$ and the electrical distance $L_{el}$ to the DUT: $\Delta\Phi°=0.024*L_{el}(cm)*\Delta F(MHz)$; in slide screw tuners $L_{el}$ is typically 10-20 cm and, in multi-channel communication, modulation bandwidth $\Delta F$ ranges from 5 to 100 MHz or higher, depending on the modulation scheme; this yields phase skewing angles between 1.2 and 48 degrees or more (FIG. 14). Hereby it must be clarified that in the modulated signal the distance between tones is defined as dF and the total modulation bandwidth is $\Delta F=2N*dF$ (N tones per sideband). This impedance spread is an uncontrollable situation, where the exact impedance is not known, it does not allow reliable measurement and needs to be redressed.

This invention discloses a method for overcoming all three above shortcomings: a) it uses electronic tuners with tuning speed of a few milliseconds; b) it uses active feedback injection, thus allowing creating reflection factor $|\Gamma|$ up to or larger than 1 at DUT reference plane; c) it allows controlled wideband tuning; prior publications and patent applications by the inventor (see ref. 5) have disclosed limited material regarding cases a) and b). Wideband tuning, case c), is possible but uses entirely different impedance synthesis methodology than disclosed in this invention: prior art wideband tuning is based on signal down and up-conversion and targeted tuning using analog to digital conversion and numerical signal processing of a real and imaginary part of each tone at intermediate frequencies (see ref. 6 and 7); this invention discloses a native direct active tuning method at RF frequencies using calibration data processing but not signal processing like the prior art.

BRIEF SUMMARY OF THE INVENTION

Figure 2:
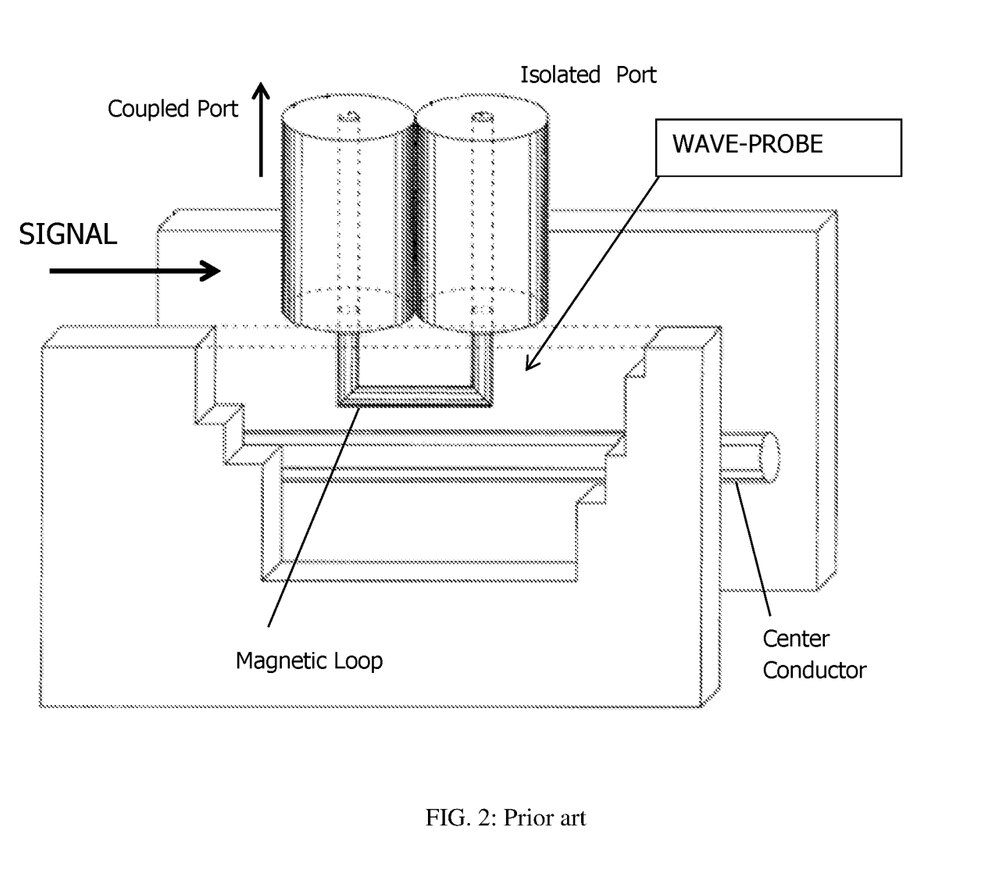
FIG. 2 depicts prior art, the perspective 3D view of a cut through a "wave-probe" type signal coupler.
Figure 4:
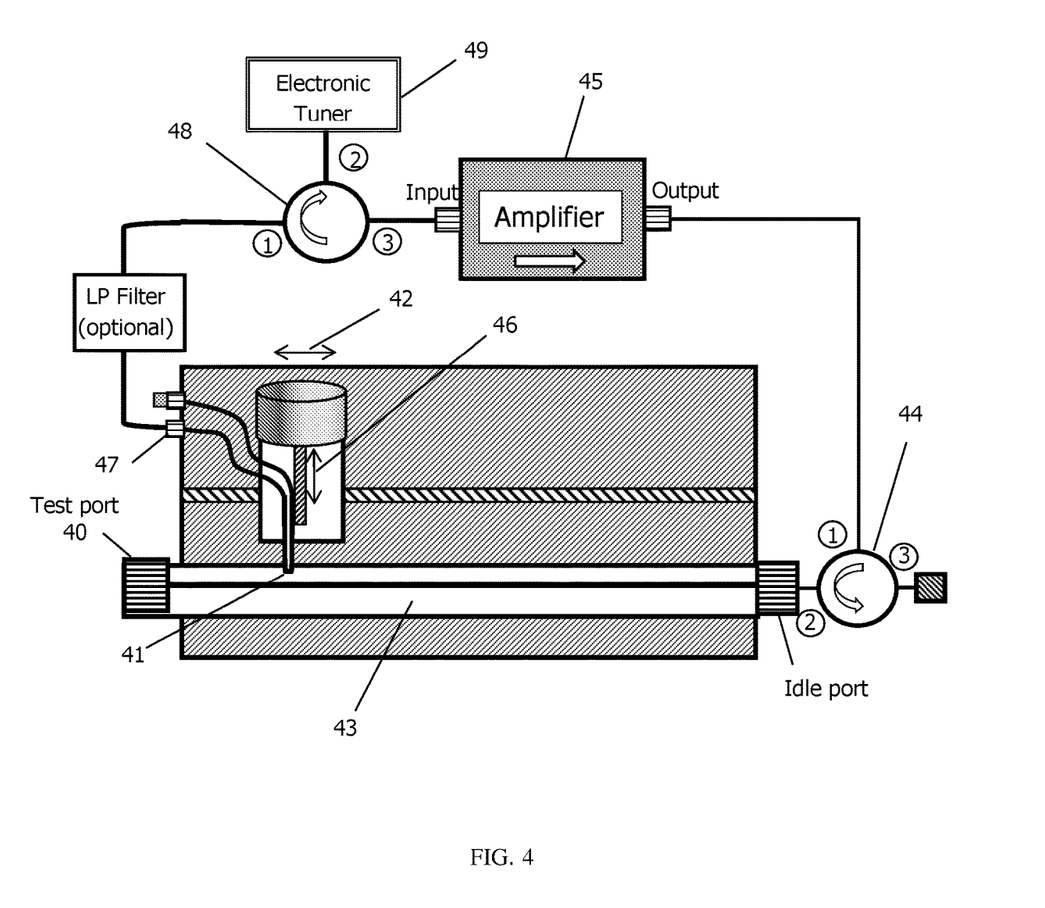
FIG. 4 depicts the structure of the active modulated load pull tuner (AMT).

This invention (FIG. 4) discloses a load pull tuner allowing simultaneously a) tuning speed of electronic tuners in the millisecond range, b) tuning range of active tuners up to $|\Gamma|=1$ and c) native targeted tuning of modulated signals. Or, the invention bypasses all weaknesses of the existing methods, in a compact solution. The new tuner is based on a low loss slotted airline (slabline) 43, an adjustable 42, 46 directional coupler (wave-probe)(see ref. 3 and FIG. 2) 41, an amplifier 45, two circulators 48, 44 and an electronic tuner 49 (FIG. 8, 9), which comprises a large number M ($\geq 24$) of remotely/electronically controlled RF switching elements, allowing at least $2^{24} \approx 17$ million impedance settings. For the purpose of this invention the term "RF switching elements" is used for any RF component that can be remotely or electronically controlled between two distinct states ON and OFF. In the ON state the RF switching element presents a THROUGH between its terminals (resistance$\approx 0$), in the OFF state it presents an OPEN (resistance≈∞). Such RF switching elements are either electro-mechanical RF switches per se, PIN diodes (see ref. 8), semiconductor variable capacitors (Varactors, see ref. 9) or microelectro-mechanical system (MEMS) varactors or MEMS switched capacitors (see ref. 10); due to the large number of RF switching elements required for the effective implementation of the invention, traditional electro-mechanical RF switches are not a realistic alternative; in combination with the properly dimensioned capacitors, shown in FIG. 9 as items 16/85, 17/86 etc. . . . a large number of widely spread impedances are created (see ref. 4 and FIGS. 7 and 12).

Figure 6:
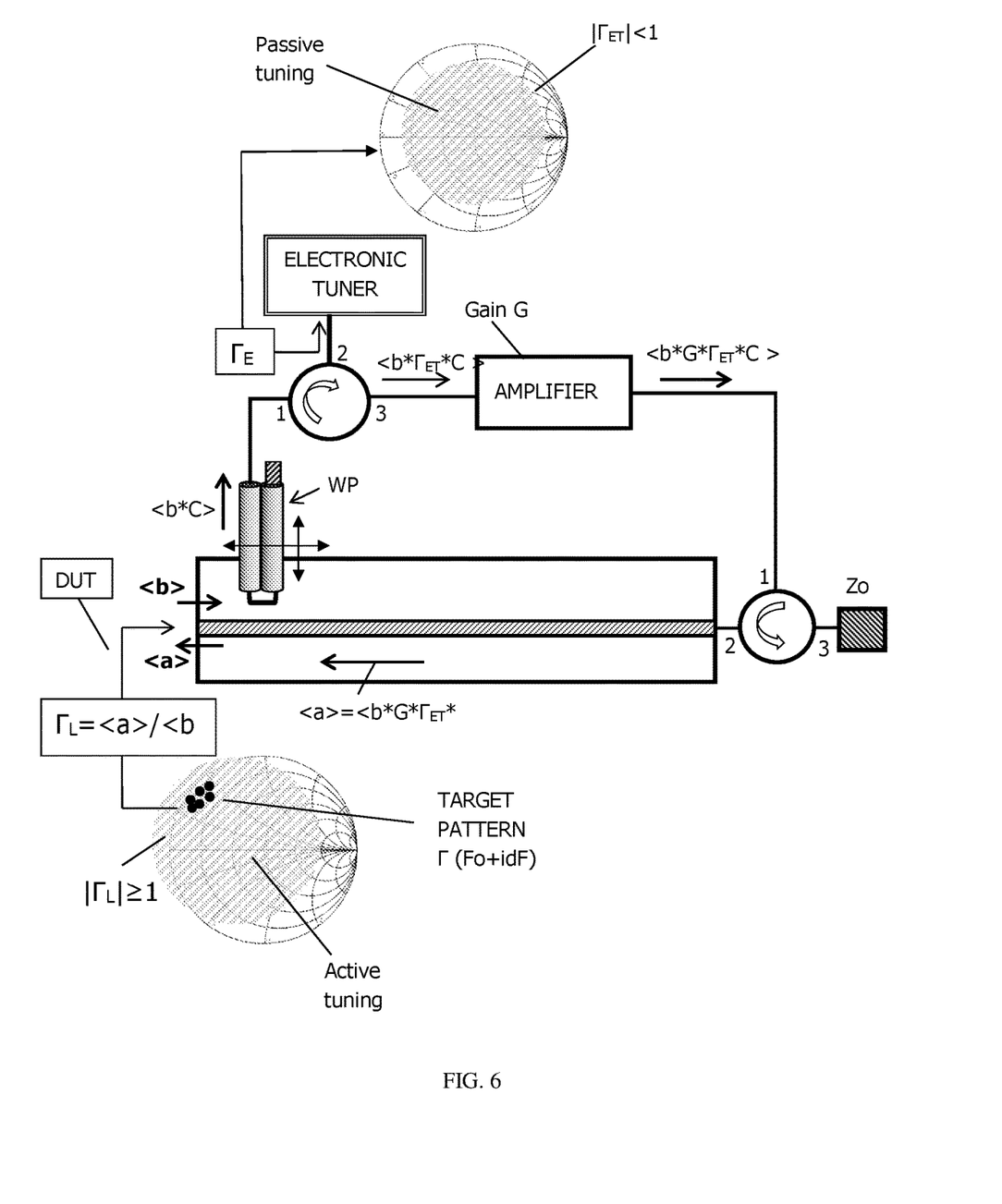
FIG. 6 depicts the full operation of modulated (multi-tone) signal load pull using AMT.
Figure 8:
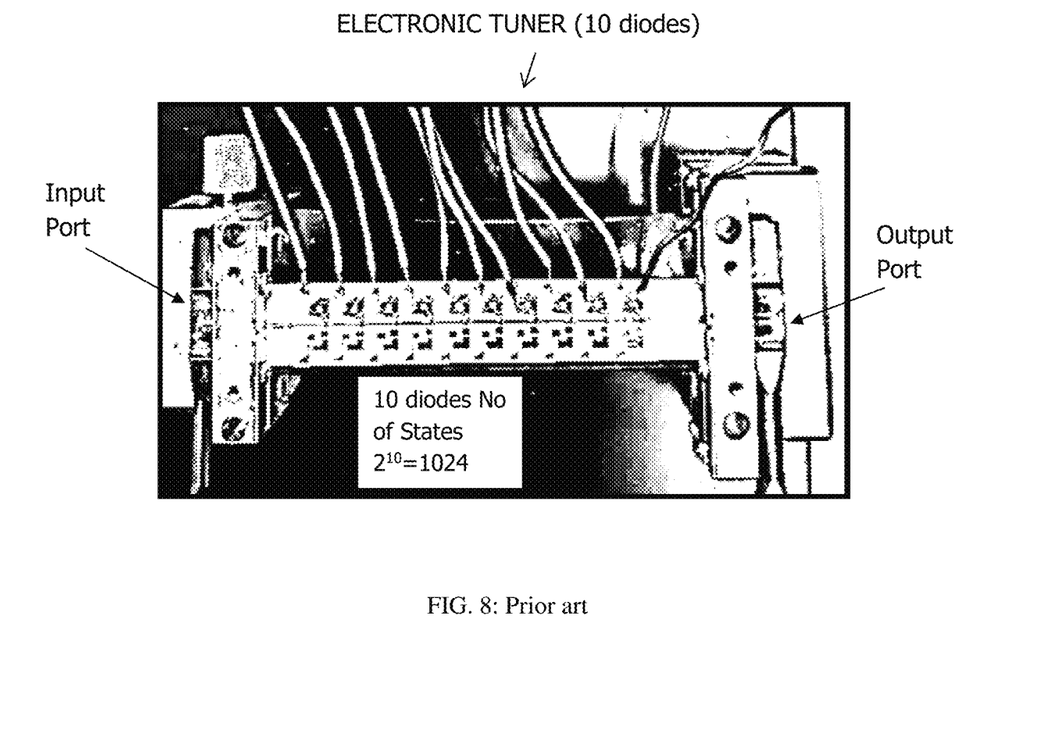
FIG. 8 depicts prior art: electronic tuner using 10 diodes.

Combined with high speed calibration routine and numerical search engines, the new tuner provides a simple and practical solution to most existing limitations of active or passive tuners: The modulated signal (FIG. 11A) from the output of the DUT enters the slabline at its test port 40. The horizontally and vertically movable wave-probe, installed on the slabline, samples a phase- and amplitude-adjustable portion of the signal through port 47 and injects it into a circulator 48, which is connected to the input port of the remotely controlled electronic tuner 49 (FIG. 8). To avoid coupling and processing undesired harmonic signals generated by the DUT, a low pass filter is inserted between the coupled port of the wave-probe and the input port of the first circulator. The electronic tuner 49 is terminated on its output port with the characteristic impedance Zo (50 Ohm). The reflected signal at the input port of the electronic tuner 49 traverses the circulator 48, exits from the third port of the circulator and enters into the amplifier 45. The amplified signal enters a second circulator 44 into its port 1, is injected back into the idle port of the slabline towards the output port of the DUT through port 2 of the second circulator 44. This creates an adjustable virtual (active) reflection factor at the test port 40. Proper calibration, data conditioning and a high-speed search engine extracts electronic tuner states allowing targeted native tuning for the wideband signal (FIG. 6).

DETAILED DESCRIPTION OF THE DRAWINGS

The invention and its mode of operation will be better understood from the following detailed description when read with the appended drawings in which:

FIG. 11A through 11B depicts frequency spectrum of multitoned modulated signal.

DETAILED DESCRIPTION OF THE INVENTION

In a basic embodiment of the invention (FIG. 4) the signal exiting the DUT from its output port enters the tuner into the test port 40; it is then sampled by wave-probe 41, of which the coupling factor is adjustable by inserting it into the slabline 43 via the vertical axis 46 of a mobile carriage controlled either manually or remotely by a vertical motor 42 and fed through port 47 and an optional low pass filter into port 1 of the circulator 48. The signal travels with negligible loss to port 2 of the circulator and is reflected by the electronic tuner 49. The reflected signal at port 2 of the circulator continues, again with negligible loss, to port 3 of the circulator and from there into the amplifier 45. The amplified signal exits at the output port of the amplifier and is injected through ports 1 to 2 of circulator 44 back into the slabline 43 towards the test port 40. The phase of the sampled portion of the signal entering the test port 40 is adjusted by the horizontal position of the wave-probe and controls the phase of the returned signal and therefore the phase of the active loop and the reflection factor at the test port 40. Depending on amplitude and relative phase of the returning signal a controllable reflection factor $\Gamma_{load}=<a>/<b>$ is generated at the test port 40, which, due to the amplification of the active part of the signal, can reach $|\Gamma_{load}|\geq 1$ at the test port 40 or even $|\Gamma_{load}|=1$ at an internal DUT reference plane beyond the test port, despite intervening insertion loss of the test fixture housing the DUT.

The particularity of this invention lies in the fact that it discloses a tuner that has the capacity of creating instantaneous arbitrary tuning patterns. Such tuners have not been reported before. The accent is on the term "instantaneous". Prior art wideband tuners (see ref. 6, 7) rely on "synthetic" tuning, i.e. numeric data processing of individual tones of the modulated signal. This happens by down-converting the modulated RF signal into an IF band, analog to digital converting each tone of the modulation, numerically process and adjust its amplitude and phase, converting back from digital to analog, up-converting and re-injecting the feed-back signal into the DUT, modified at will. Of course, this does not happen in the same signal period. It is impossible to create non-causal systems. The phase of any signal transmission turns negative along the transmission line. But using the trick of down- and up-converting the numerically processed signal tones emulates a "at will" modulated signal scheme. Not so in this invention. There is no down- and up-conversion here. The modulated signal is processed in real time. The digital electronic tuner operates only at RF frequency. The large number of high speed ON/OFF switching elements only guarantees a very large number of possible tuner states (in the tens or hundreds of millions) allowing a realistic chance of finding, through numeric data search, tuner states responding, in real time, to the target impedance trajectory, including, eventually also trajectories with positive phase change over frequency, realized through multiple reflections. Again, this is not a deterministic approach. There is no guarantee or theoretical proof that there are always solutions. Experimental findings suggest that there are. In that sense the proposed tuner, together with the calibration and tuning algorithms, is new and not obvious, despite hardware similarities with existing art.

The actual signal propagation in the tuner is shown, in a simplified manner, in FIG. 6. From the entering signal <b> an adjustable portion <b*C> is sampled and injected into port 1 of the circulator. C is the coupling factor of wave-probe (WP). This signal portion is reduced by the transmission factor S21 ($\approx$1) of the circulator and is reflected by the reflection factor $\Gamma_{ET}$ at the electronic tuner (<b*$\Gamma_{ET}$*C>) and sent back into port 2 of the circulator. From there, reduced again by S32 ($\approx$1) of the circulator this signal is injected into the amplifier and exits amplified by the amplifier Gain G: (<G*$\Gamma_{ET}$*b*C>); hereby we assumed S21 and S32 of the circulator to be approximately 1. In fact, they are typically 0.95 to 0.99 depending on circulator type and frequency. Exact calculations are possible but will not change the scope of the invention. Subsequently this amplified and tuned signal is injected back into the slabline via the second circulator creating a returning signal <G*$\Gamma_{ET}$*b*C> creating a reflection factor:

$$\Gamma_{load} = <a>/<b> \approx G*\Gamma_{ET}*C \quad \text{(eq. 1)}$$

To reach this simplified, though representative, relation we assumed the circulator to be ideal (S21=S32) and spurious couplings into the isolated ports of the wave-probe to be negligible. All this is not exactly true, but it can be assumed to be for the sake of simplicity. An exact calculation can be carried through but will not alter the scope of the invention. The relations are true and lead to useable results because the amplitudes and phases of the overlapping vectors are easily adjustable. What is important here is the capability of the system to adjust the returning signal by easily adjusting the coupling factor C and pre-tune to the desired points using a combination of coupler/active loop phase and fast dynamic tuning $\Gamma_{ET}$. This, no hitherto solution can do as effectively.

Figure 3:
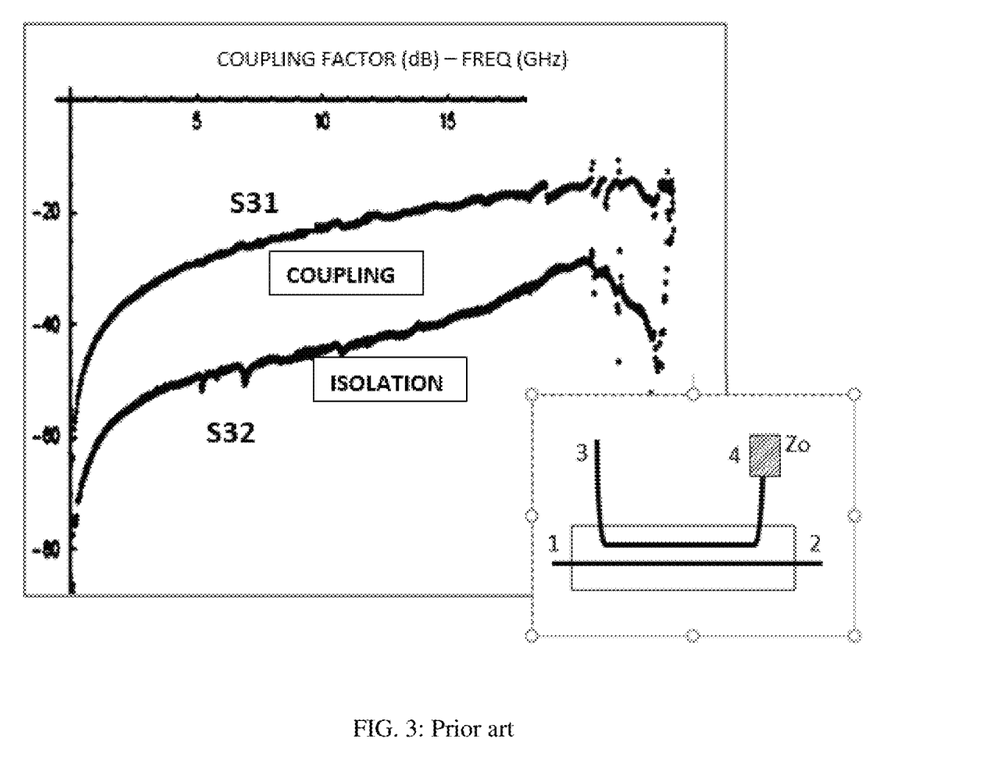
FIG. 3 depicts prior art, measured coupling (S31) and isolation (S32) of a wave-probe and associated port definitions.
Figure 7:
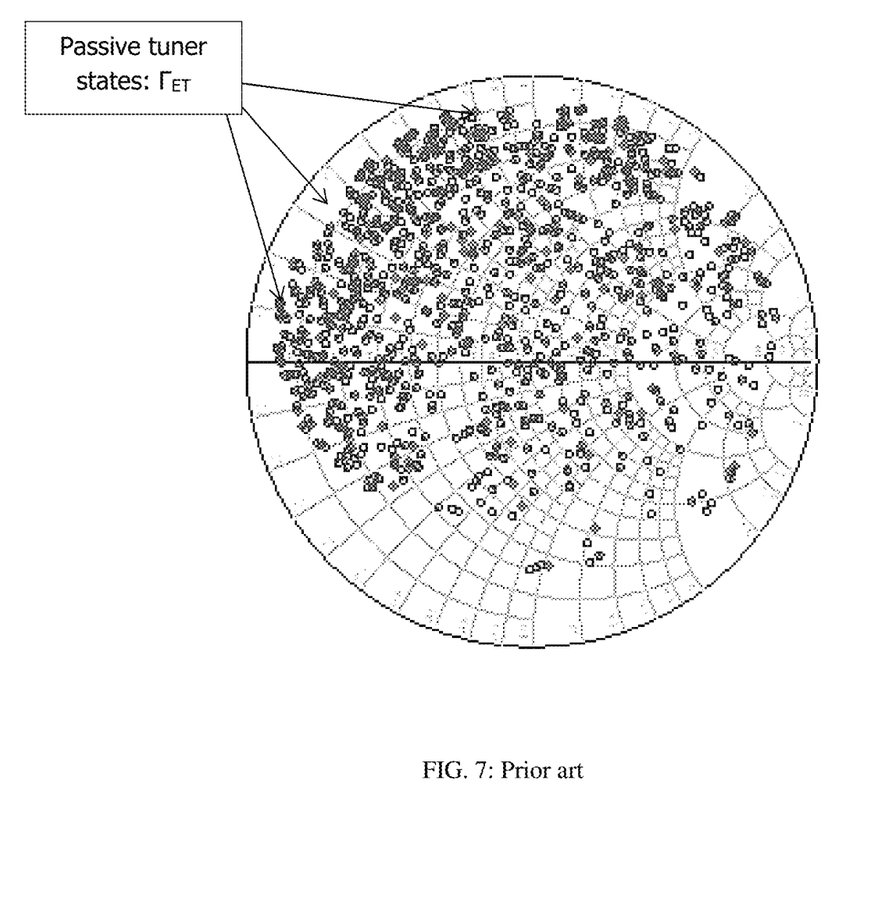
FIG. 7 depicts prior art: Multitude M of impedances (reflection factors) generated by an electronic tuner using D=10 diodes at its test port; $M=2^D=2^{10}=1024$ tuner states.

FIG. 6 shows the mechanics of the active modulated tuner: What is needed in an active feedback injection loop, common in all active load pull systems, is, either an independent synchronized second signal source, or an amplitude and phase control of a portion of the signal coming out of the DUT, before it is amplified and re-injected back into the DUT. Control must be before the amplification in order to operate the amplitude and phase controller at low power and "linear" operation and, at the same time, avoid insertion loss after the amplifier and extract maximum "expensive" power from the amplifier. In the present case this is accomplished using the mobile wave-probe (WP). A portion <b*C> of the signal is coupled into the active loop, whereby C is the coupling factor (S31) see FIG. 3. This signal portion is directed from port 1 to port 2 of the first circulator to the input port of the electronic tuner (FIGS. 8 and 9) where it is reflected by $\Gamma_{ET}$ as shown in FIG. 7. The reflected signal <b*C*$\Gamma_{ET}$> is directed to port 3 of the circulator and from there to the amplifier. The amplified signal <b*C*$\Gamma_{ET}$*G> is directed back into the slabline via ports 1 and 2 of the second circulator. Any power coming out of the slabline is directed to port 3 of the circulator and absorbed at the matched load Zo. As shown before the virtual load presented to the DUT is <a>/<b>=<C*$\Gamma_{ET}$*G>. Or by controlling the amplitude and phase of C one can transform the tuning cloud $\Gamma_{ET}$ of the electronic tuner into a new tuning cloud $\Gamma_L$ seen by the DUT. The multitude of available tuning states then allows creating impedances matching the Target Tuning Pattern $\Gamma$(Fo+i*dF) comprising 2N+1 (N$\geq$0) tones around the center frequency Fo (for N=0 we only have the carrier Fo) and the associated sideband tones Fo+i*dF, with $-N\leq i\leq N$, and dF being the distance between tones. The gain of the amplifier allows the re-injected signal to be large enough to compensate for any insertion loss and the limited tuning range of the electronic tuner (FIG. 7). For the purpose of faster search the reflection factor is saved in Cartesian real and imaginary parts Xi=Real ($\Gamma$(Fo+i*dF)) and Yi=Imag($\Gamma$(Fo+i*dF)) whereby $-1\leq Xi\leq 1$ and $-1\leq Yi\leq 1$; for faster numeric processing Xi and Yi are typically conditioned by converting from float to integer.

Figure 9:
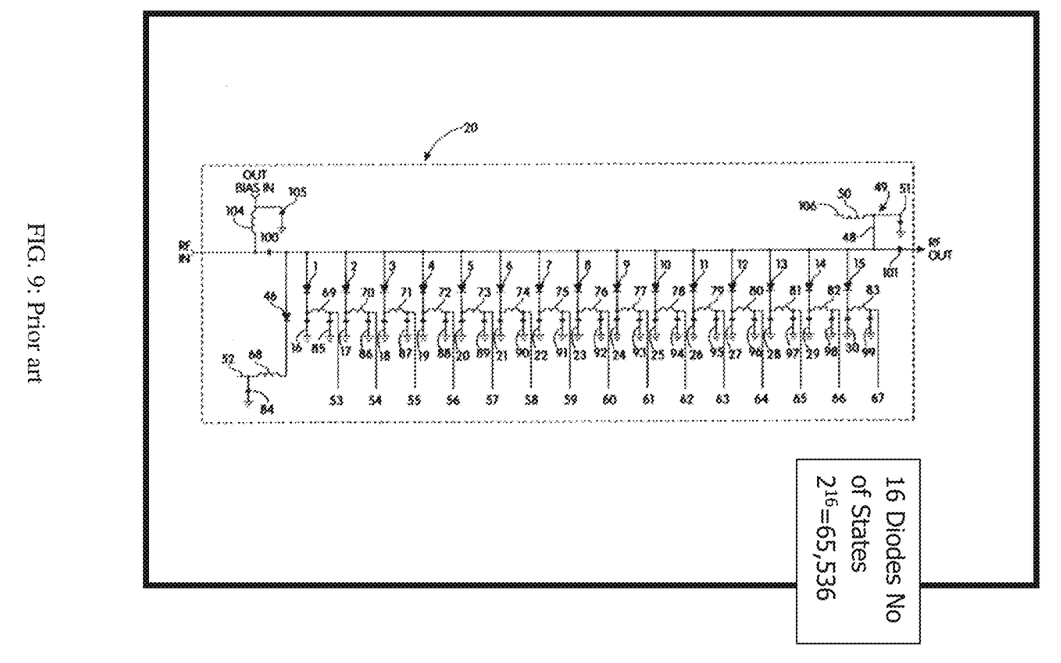
FIG. 9 depicts prior art: electronic tuner schematics using 16 diodes creating $M=2^{16}=65,536$ tuner states (impedances).
Figure 12:
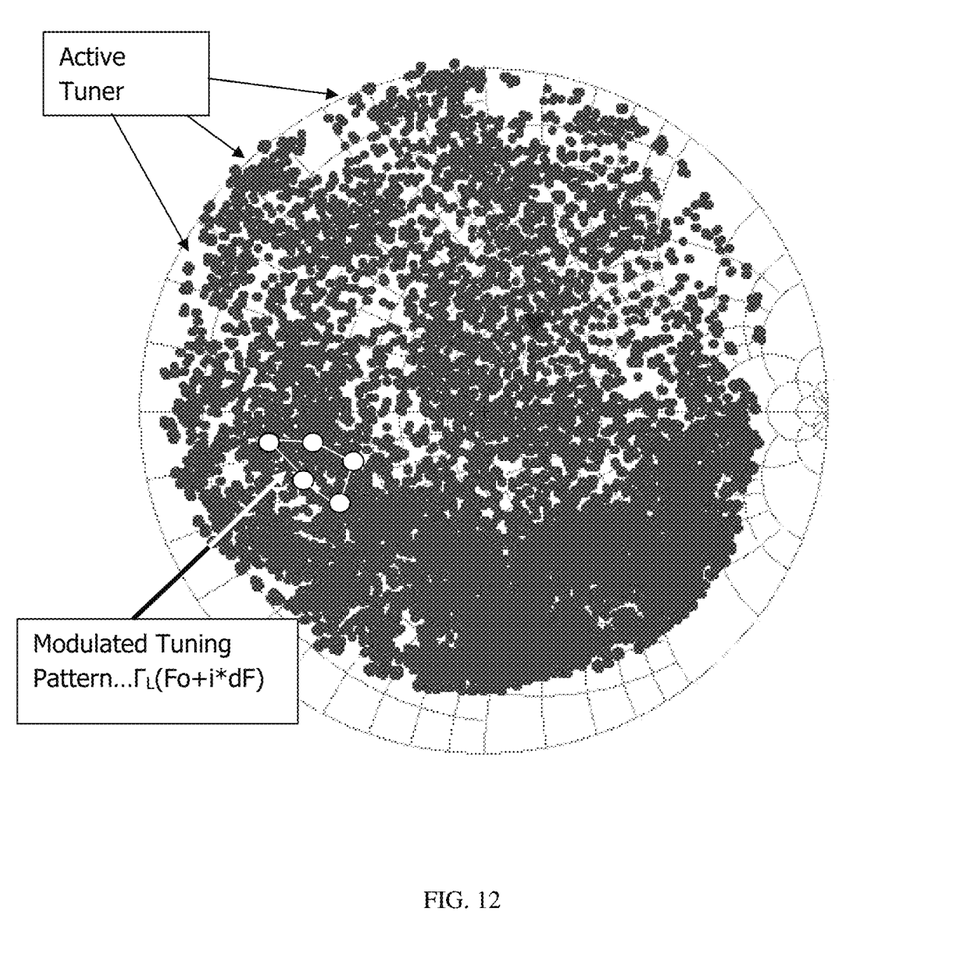
FIG. 12 depicts active tuning as presented to the DUT overlapping the modulated signal tuning pattern.

FIG. 7 shows the multitude of tuner states created by the electronic tuner. The electronic tuner uses diodes and is digital. It can generate $M=2^D$ distinct tuner states (impedances) at any given frequency, assuming it comprises D diodes. PIN diodes is the preferred choice, even though variable capacitors (Varactors) or MEMS are also possible. The PIN diodes are connected parallel to each-other between the transmission line and ground (FIG. 9). When biased positive they represent a near Short circuit, they are switched ON. When they are biased negative, they represent a near OPEN circuit, they are OFF. When all diodes are OFF we see approximately a 50 Ohm transmission line. Switching diodes alternatively or combined from OFF to ON state creates the number M of possible combinations. The reflection factors on FIG. 7 are neither regular nor homogenously distributed. Neither are tuning states between the points reachable. The response of this tuner cannot be interpolated. To be able to reach very accurately any arbitrary impedance on the Smith chart one simply needs a high number of states, such as shown in FIG. 12. As an example, electronic tuners with 10 RF switching elements (creating 1024 states each) can be cascaded. Two cascaded units create $1024^2\approx$1 million states, three units create approximately 1 billion states. Direct full calibration is impossible, because of the required time; fast calibration is possible if we use a segmented technique, whereby each group of RF switching elements is calibrated separately and the result is cascaded in memory to create the totality of permutation states; for instance each 10-RF switch unit is calibrated separately for all 1024 permutations and then the s-parameters of the combined permutations are cascaded in memory.

Figure 10:
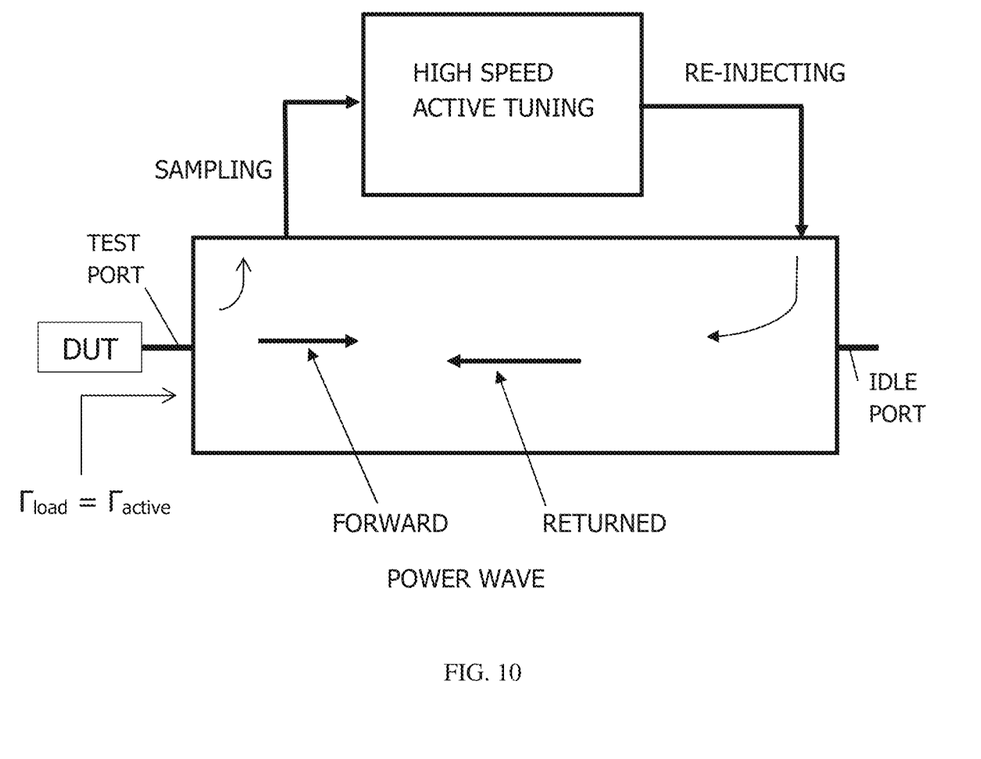
FIG. 10 depicts the general concept of high speed active tuner.

FIG. 8 is a photograph of a prototype electronic tuner, manufactured based on an invention of the early nineties (see ref. 4), the schematics of which is shown on FIG. 9. FIG. 10 depicts the basic concept of the active tuner segregated in active tuning unit and transmission slabline with a basic indication of signal flow.

Figure 11A:
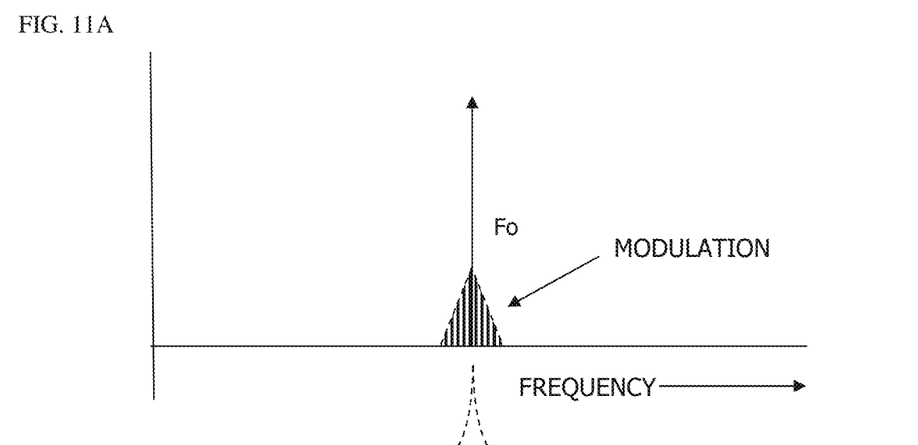
FIG. 11A depicts condensed spectrum.
Figure 11B:
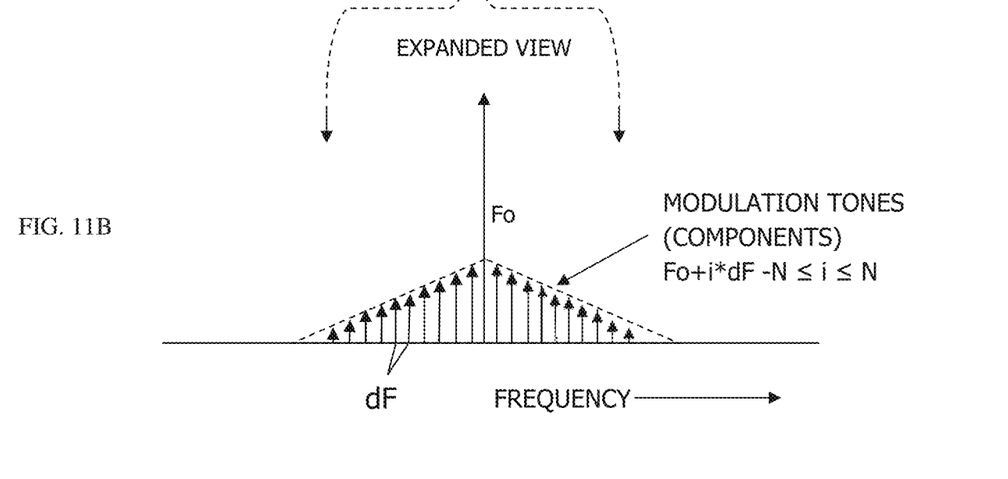
FIG. 11B depicts detailed spectrum with individual tones.

A modulated signal comprises a large number of sideband components. For the sake of economy and a practical solution the modulation band is divided in discrete tones (FIG. 11). FIG. 11B shows an expanded view of the modulation sidebands. The tuner is calibrated and used to tune only at the discrete sideband tones. Continuity has it that any future matching network that responds closely to the tuned pattern (FIG. 12) will also respond closely between the tuned impedances. The obvious reason is that the electronic tuner itself and typical matching networks use the same kind of wideband RF components, open and short circuits, inductors, capacitors, transmission lines etc. Calibration and tuning is therefore restricted to a selected number of modulation tones Fo$\pm$k*dF; k=1,2,3 . . . N. Herein dF is the frequency distance between tones. The number of tones 2N+1, i.e. the carrier Fo and N tones on each side of the carrier Fo, and the delta frequency dF are user selectable and chosen for best operation (calibration and tuning) and compromise between the volume of data and the tuning speed, depending on modulation bandwidth.

Figure 13:
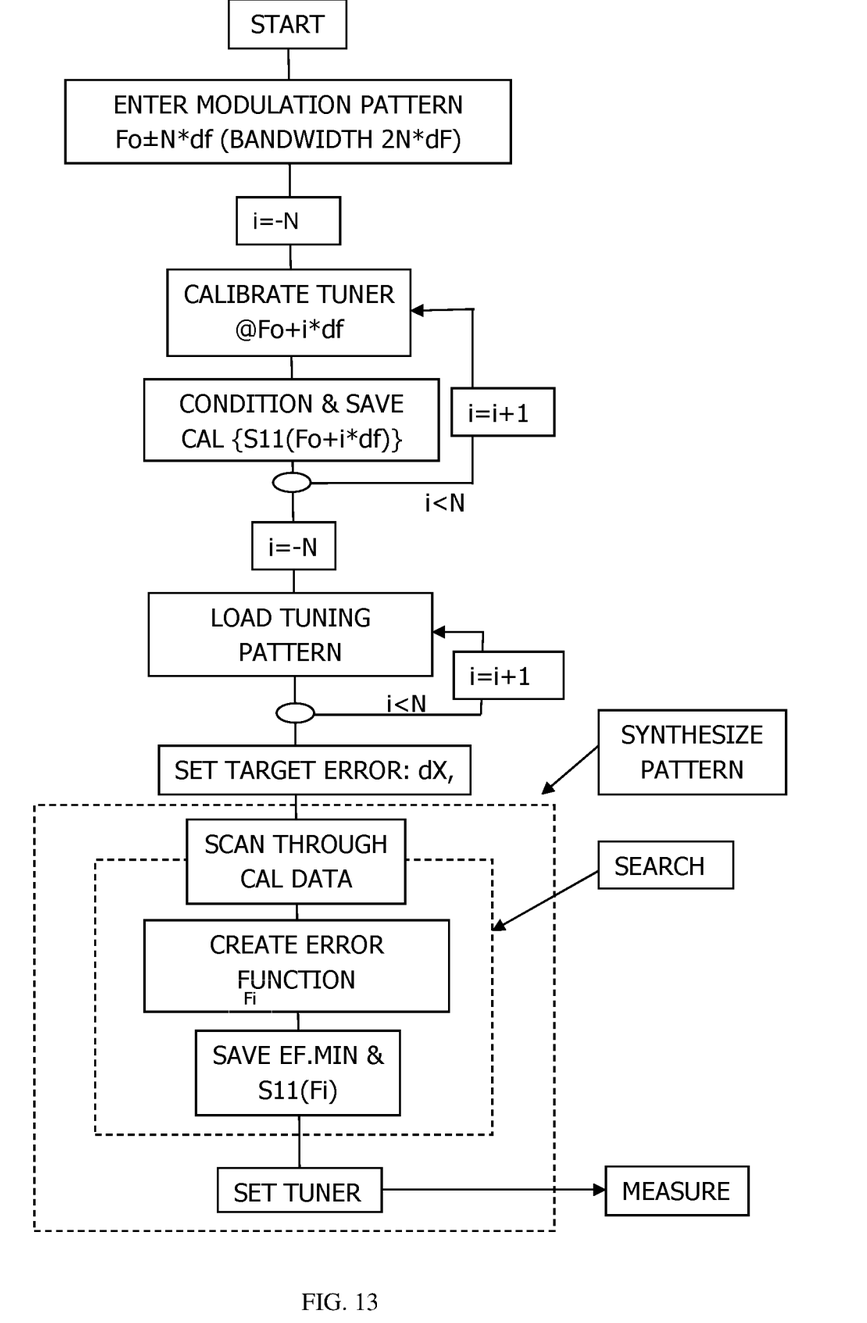
FIG. 13 depicts the flowchart of calibration and wideband tuning algorithm for modulated signal.

The calibration and tuning flowchart is shown in FIG. 13: First the modulation bandwidth ΔF=2N*dF is defined and the modulation pattern entered. The tuner is then calibrated at the discrete frequencies Fi=Fo+i*dF whereby i varies from −N to N as described before and the calibration data are saved. To speed up the subsequent search routine various numerical methods can be used. Without restriction of generality it is suggested to save all calibration data in X, Y format (X=Real(Γ), Y=Imag(Γ)) and save as integer numbers, by multiplying by a factor of 1,000,000. This way a vector of (0.123456,−0.789123) becomes (123456,−789123). Processing integer numbers numerically is much faster than processing float (real) numbers. The tuning starts by loading a first target point (Xo, Yo) and searching through the data for a best match at the center frequency Fo. It is faster to check first the real part (X) in a first pass and save the data satisfying the tolerance Xo−dX<X<Xo+dX in a block {X} together with the associated Y and the RF switching element settings; then in a second pass, the data in block {X} are checked against Yo−dY<Y<Yo+dY and a set of tuner RF switching element settings selected; this is valid for Fo. The search continues among the initial tuner settings for all tones Fi=Fo+i*dF and all reflection factors (Xi, Yi) yielding a restricted set of RF switching element settings. Finally, all tuner settings are compared and those are retained with the smallest Error Function EF. EF is defined as the sum of all vector errors between target reflection factors and associated solutions inside the tuning tolerances EF=Σ|S11-S11.T|; S11 is the calibrated reflection factor, S11.T is the target. S11 can be used instead of Γ, since the tuner is terminated with 50 Ohm.

Not all solutions found will have the same error. We select only the best. It is possible that for some target patterns there will be no solution for all tones. In that case the result is either accepted as such and the points excluded from tuning, or the tolerances increased, and the search repeated. The tuning method is based on statistics. There is no guarantee that there always be a solution. But it seems the only practical approach, since all traditional passive and active tuners show a skewing phase behavior (FIG. 14).

Figure 5:
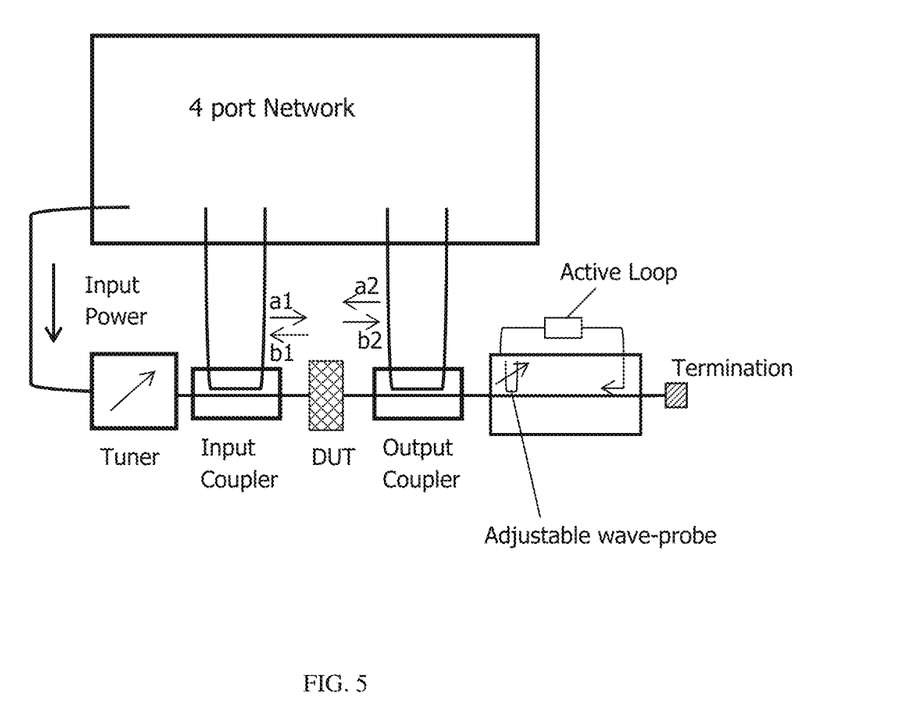
FIG. 5 depicts load pull measurement setup using AMT and four port vector receiver (network analyzer, VNA).

Active tuners can be pre-calibrated, but the performance depends on the power generated by the DUT, since it drives the feedback amplifier into compression and affects its gain and transmission phase. A pre-calibration is therefore useful only to pre-tune. The actual impedance seen by the DUT shall be measured "in situ", as shown in FIG. 5. If the amplifier is driven too hard into saturation and non-linearity and the impedances drift significantly the tuning may be lost. In the setup of FIG. 5 each tone of the injected signal is sampled by the input bidirectional coupler: Power wave <a1> goes into the DUT and power wave <b1> is reflected. Equivalent at the output, power wave <b2> is extracted from the DUT and <a2> injected back, creating the load reflection factor <a2>/<b2>. The active tuner retrieves a portion of <b2>, phase-adjusts and amplifies it via the wave-probe and the electronic tuner in the active loop and injects it back. The same for all tones <bi>.

This application discloses the concept of a high speed active load pull tuning system for modulated wideband tuning operations (AMTS=Active Modulated Tuning System). Obvious alternatives shall not impede on the originality of the concept.

What I claim as my invention is:

1. A computer-controlled load pull system for tuning using a modulated RF (radio frequency) signal, including an active load pull tuner, having a test port and an idle port, said tuner comprising:

a slabline having a center conductor, an input and an output port;

an adjustable signal coupler comprising a wave-probe having an input port, an output port, a coupled port and an isolated port;

a first circulator C1 and a second circulator C2, each having a port 1, a port 2 and a port 3;

a remotely controlled electronic tuner comprising a number M of RF switching elements;

an amplifier having an input port and an output port;

RF cables and 50 Ohm characteristic impedance terminations;

wherein the wave-probe is cascaded with the slabline, the input port of the wave-probe is the test port of the active load pull tuner, the coupled port of the wave-probe is connected to port 1 of circulator C1, port 2 of circulator C1 is connected to the electronic tuner, port 3 of circulator C1 is connected to the input port of the amplifier, the output port of the amplifier is connected to port 1 of the circulator C2, and port 2 of the circulator C2 is connected to the output port of the slabline, and wherein the isolated port of the wave-probe and port 3 of the circulator C2 are terminated with the 50 Ohm characteristic impedance termination.

2. The active tuner of claim 1, wherein the RF switching elements are PIN diodes.

3. The active tuner of claim 1, wherein the RF switching elements are Varactors.

4. The active tuner of claim 1, wherein the RF switching elements are microelectromechanical system (MEMS) varactors or MEMS switched capacitors.

5. The active tuner of claim 1, wherein the wave-probe is integrated in the slabline.

6. The active tuner of claim 1, wherein a low pass filter (LPF) is inserted between the coupled port of the wave-probe and port 1 of circulator C1.

7. A calibration method for modulated signal for the active load pull tuner of claim 1, said modulated signal having a center frequency Fo and comprising 2N+1 tones Fi wherein $$Fo-N*dF<Fi<Fo+N*dF,$$

with N≥0, −N≤i≤N and dF being the frequency distance between tones;

said method comprising the following steps:

a) connecting the active tuner to a pre-calibrated network analyzer;

b) initializing all RF switching elements to an OFF state;

c) creating $2^M$ impedance permutations by switching the RF switching elements between their ON and OFF states and measuring s-parameters at all 2N+1 tones Fi, d) conditioning and saving matrices [S11(Fi)] for 0≤i≤2N, wherein S11 is a calibrated reflection factor.

8. A modulated signal tuning method performed using the calibration data of claim 7, comprising
   a) entering tuning reflection factor targets $\Gamma(Fi)=Xi+j*Yi$ and tolerances dX and dY;
   b) searching through conditioned data in two passes,
      i) pass 1 extracts calibration points satisfying Real part tolerance Xi±dX and saves in a data block {Xi} with the associated RF switching element settings,
      ii) pass 2 searches through block {Xi} and extracts calibration points satisfying Imaginary part tolerance Yi±dY with the associated RF switching element settings and saves in a data block {XiYi};
   c) searching in data block {XiYi} and selecting a first calibration point Xo, Yo for smallest deviation from targets Xi, Yi;
   d) configure the RF switching elements to the setting associated with Xo, Yo.

\* \* \* \* \*